United States Patent [19]
Lee

[11] Patent Number: 5,191,620
[45] Date of Patent: Mar. 2, 1993

[54] METHOD FOR CONTROLLING VOLUME LEVEL OF SOUND FOR A DISPLAY

[75] Inventor: Sang-Su Lee, Suweon, Rep. of Korea

[73] Assignee: Samsung Electronics Co., Ltd., Suwon, Rep. of Korea

[21] Appl. No.: 516,533

[22] Filed: Apr. 30, 1990

[30] Foreign Application Priority Data
Oct. 5, 1989 [KR] Rep. of Korea ............... 89-14486

[51] Int. Cl.5 ............................................. H03G 3/00
[52] U.S. Cl. .................................... 381/105; 381/109; 340/722; 340/753
[58] Field of Search ............... 381/109, 104, 107, 105; 340/722, 753, 754

[56] References Cited
U.S. PATENT DOCUMENTS 4,706,294 11/1987 Ouchida .......................... 381/109
4,847,785 7/1989 Stephens ...................... 340/722 X

*Primary Examiner*—Forester W. Isen
*Attorney, Agent, or Firm*—Robert E. Bushnell

[57] ABSTRACT

A method for controlling a volume level of a sound includes an input discrimination routine, a display routine, an increment routine and a decrement routine, whereby a maximum and minimum level of the PWM output are displayed on the screen. The routines are carried out by a MICOM for receiving a key-input signal and controlling a set. The method may reduce tint phenomenon of the screen by controlling the center level of an OSD(On Screen Display) using 0-64 levels for the OSD according to the output of the MICOM.

11 Claims, 2 Drawing Sheets

0 LEVEL

64 LEVEL

FIG. 3(A')

| NUMBER OF LEVEL | 0 | 1,2 | 3,4 | 5,6 | 7,8 | ..... | 61,62 | 63,64 |
|---|---|---|---|---|---|---|---|---|
| NUMBER OF BAR | 0 | 1 | 2 | 3 | 4 | ..... | 31 | 32 |

METHOD FOR CONTROLLING VOLUME LEVEL OF SOUND FOR A DISPLAY

BACKGROUND OF THE INVENTION

The present invention relates to a method for controlling the volume level of sound which can reduce the tint phenomenon of a screen by controlling the center level of OSD on-screen display using 0-64 levels for the OSD according to the output of a MICOM(Microcomputer), in the display apparatus of various electric systems with the OSD faculty using the level controlled by a PWM(Pulse Width Modulation) manner.

Generally, in the electric systems such as TV, VCR and audio in a MICOM which can control the pulse width and the OSD faculty is possible. When the volume of sound is controlled by using the PWM output and the OSD faculty, a 6-bit PWM output signal can control 64 levels and the controlled level is displayed by a bar type through the OSD, where the bar appears every two levels, that is, totally 32 bars. But, in this case, the lowest level is 0-level, while the highest level is 63-level, so that the OSD is displayed by 63 levels even if 64 levels is possible for the OSD. Thus, under the PWM output with 63 levels, the center bar is not determined, so that the tint of the screen can not be controlled accurately. That is, the brightness becomes a maximum at the center bar, while the center bar is placed between 16th and 17th bars under 63 levels, so the accurate adjustment of brightness is impossible.

SUMMARY OF THE INVENTION

It is an object of the present invention to provide a method for controlling the volume level of sound which can adjust the tint of the screen by putting the center bar at the 17th position, when the 6-bit PWM output controls the level, after displaying the lowest level as zero and setting total number of levels to 64.

To achieve the above object, in a circuit for controlling the volume level of sound for a display comprising a MICOM for receiving a key-input signal transmitted from a transmitter and a key-matrix and for controlling a set, a DC converter for converting a control signal (PWM output) of the MICOM into a DC level, and an OSD part for displaying an output state of the MICOM on a screen, there is provided a method for controlling volume level of sound comprising the routines carried out by the MICOM of: an input discrimination routine for discriminating the signal transmitted from the transmitter; an increment routine for controlling the OSD part and the DC converter when the input signal is an up-signal; a decrement routine for controlling the OSD part and the DC converter when the input signal is a down-signal; and a state display routine for displaying the DC converter and the OSD part controlled by the increment routine or the decrement routine on the screen for a constant time and for removing the OSD part; whereby a maximum and a minimum level of the PWM output are displayed on the screen.

BRIEF DESCRIPTION OF THE DRAWINGS

These and other objects, features, and advantages of the present invention will become more apparent from the following description for the preferred embodiments taken in conjunction with the accompanying drawings, in which:

FIG. 3(A') is an alternative state diagram of an OSD.

DETAILED DESCRIPTION OF THE PREFERRED EMBODIMENT

The present invention will be now described in more detail with reference to the accompanying drawings.

Figure 1:
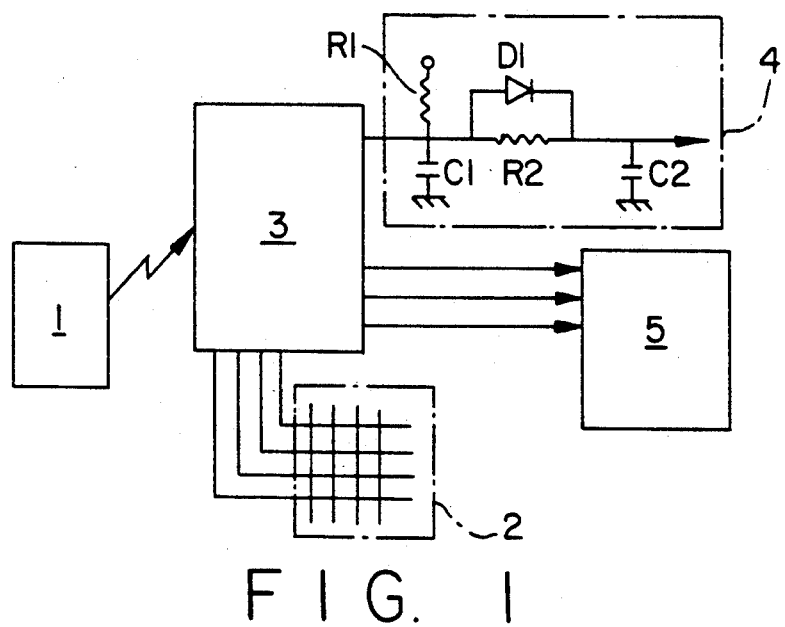
FIG. 1 is a block diagram illustrating a level controlling circuit using PWM.
Figure 3A:
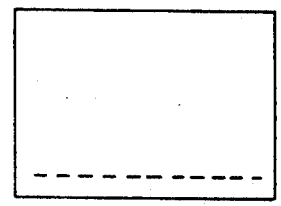
FIG. 3(A) is a state diagram of an OSD.
Figure 3B:
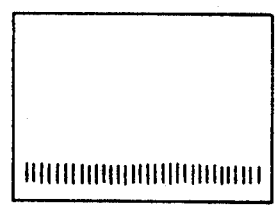
FIG. 3(B) is a table showing the relation between the value of level for the OSD and the number of displayed bars.

FIG. 1 is a level controlling circuit of the present invention using Pulse Width Modulation. The level controlling circuit includes a MICOM 3 for controlling a PWM output and an OSD output by receiving a key-input of a transmitter 1 and a key-matrix 2, a DC converter 4 with a low pass filter for converting the PWM output to a DC signal, and an OSD part 5 for displaying the control state on a screen by receiving the OSD output of the MICOM 3. The low pass filter includes a first integrator having a resistor R1, a capacitor C1 to shape the waveform of a set control signal, and a second integrator having a resistor R2, a capacitor C2 and a diode D1 to prevent reverse current. The MICOM 3 controls the set control signal (PWM signal) and the signal for the OSD part 5.

Figure 2:
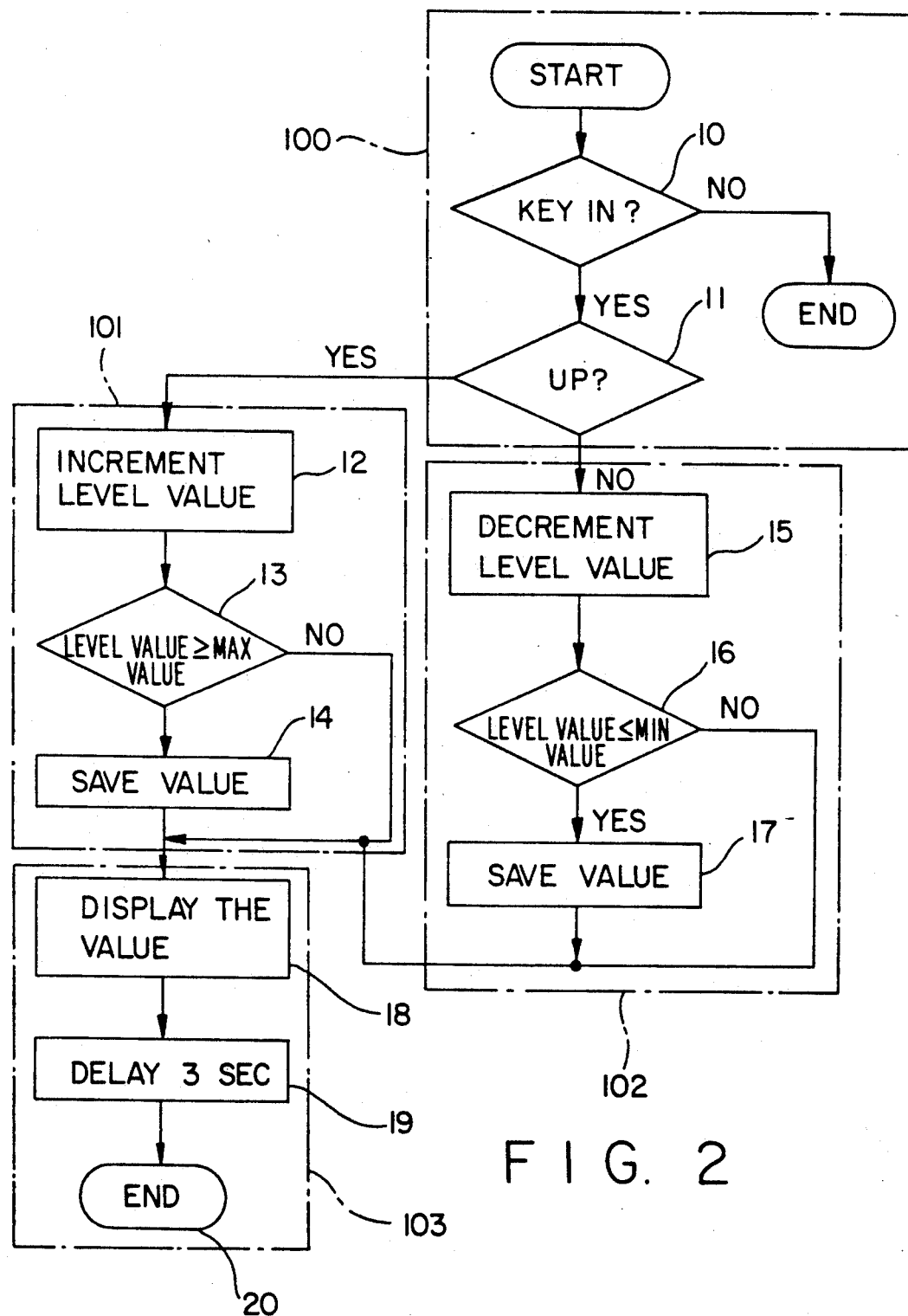
FIG. 2 is a flowchart showing the level control sequence of a MICOM.

Referring now to FIG. 2, an input discrimination routine 100 includes a key-check step 10 for checking either existence or nonexistence of the transmitted key-input signal from the transmitter 1 or the key matrix 2 and an input-discrimination step 11 for discriminating whether the key-input signal is an up-signal or a down-signal. If the input signal is discriminated as an up-signal, the level of the set control signal is increased and the bars displayed on the screen are also increased through a bar-increment step 12. Next, a maximum-discrimination step 13 for checking whether the number of the bars increased by the bar-increment step 12 is a maximum or not is carried out and then if it is a maximum value, a maximum value storing step 14 is carried out. An increment routine 101 includes the bar-increment step 12, the maximum-discrimination step 13, and the maximum value storing step 14.

On the other hand, the key-input discrimination step 11 decreases the set control signal (PWM signal) of the MICOM 3 if the key-input signal is a down-signal and a bar-decrement step 15 is carried out to decrease the output of the OSD part 5. Next, a minimum-discrimination step 16 is carried out to check whether the number of the bars decreased by the bar-decrement step 15 is a minimum or not, and then if it is a minimum value, a minimum-value storing step 17 is carried out. The stored values in the storing steps 14 and 17 of the increment and decrement routines 101 and 102 are displayed by bars of the OSD through a display step 18.

At this time, although the number of bars is neither maximum nor minimum, the bars are displayed on the screen. Next, the bar-removal step 19 is carried out to remove the displayed bars after a constant time. The display and bar-removal steps 18 and 19 are included in a state-display routine 103.

The operation of the present invention will be now described with reference to the flowchart shown in FIG. 2.

First, the MICOM 3 initializes the set for the OSD mode to control the volume level of sound. The key-check step 10 checks either existence or nonexistence of the key-input transmitted from the transmitter 1 or key-matrix 2 and the input-discrimination step 11 checks whether the input signal is an up-signal or a down signal. Then, if the key-input signal is an up-signal, the PWM pulse output, and the set control signal, are increased as long as the up-signal is applied and the bars of the OSD part 5 are increased at the same time.

On the other hand, if the up-signal is not applied continuously, the increment of the PWM output and the bars is stopped. But, if the value of the level becomes a maximum value by continuous inputs of the up-key, the maximum-discrimination step 13 stops the increment of the PWM output, and the level is fixed to 64-level. The reason that the maximum level becomes 64-level is because the level is already adjusted to 64-level for the maximum level. If the increment of the PWM output and the level is stopped, the OSD part 5 displays 32 bars for 3 seconds through the display step 18, and after 3 seconds the bar-removal step 19 removes the bars. That is, when the up-signal is continued until the level becomes a maximum value, the increment of the PWM output and level is stopped, and the 32 bars corresponding to 64-level of sound is displayed to show that the current PWM output is adjusted to 64-level.

Contrarily, if the applied input signal is a down-signal, the PWM output is decreased by the bar-decrement step 15 and the level is also decreased when the down-signal is applied. The minimum-discrimination step 16 discriminates the minimum of the level. But, if the value of the level becomes a minimum value by continuous inputs of the down-key, the decrement of the PWM output and level is stopped and the OSD part 5 displays its state using the display step 18.

Similarly, if the input signal is not continued, the OSD is removed after 3 seconds by the bar-removal step 19. That is, the fact that the current level is set to the minimum level is informed to the users. Thus, by displaying the minimum level as 0-level and the maximum level as 64-level, the PWM output is controlled ranging from 0-level to 64-level, thereby making the set up of the center bar and the adjustment of tint on screen easy.

The invention is in no way limited to the embodiment described hereinabove. Various modifications of disclosed embodiment as well as other embodiments of the invention will become apparent to persons skilled in the art upon reference to the description of the invention. It is therefore contemplated that the appended claims will cover any such modifications or embodiments as fall within the true scope of the invention.

What is claimed is:

1. A process for controlling and displaying a volume level of an audio sound having a MICOM for receiving a key-input signal transmitted from a transmitter and/or a key-matrix, comprising the steps of:

providing a pulse width modulated signal having six-bits corresponding to a range of $2^n$ volume levels where n is a positive integer, with said range extending from a minimum volume level through a maximum volume level of sixty-four;

converting said pulse width modulated signal into a DC level to control said level;

providing an On-Screen Display for displaying a plurality of bars indicative of sixty-four volume levels of said audio sound to enable controlling of said volume level of audio sound;

performing an input discrimination routine for discriminating the key-input signal transmitted from the transmitter and/or the key-matrix;

performing an increment routine to increase said volume level and controlling the On-Screen Display when the key-input signal is an up-volume signal;

performing a decrement routine to decrease said volume level and controlling the On-Screen Display when the key-input signal is a down-volume signal; and performing a state display routine for displaying the plurality of bars on the On-Screen Display controlled by one of the increment routine and the decrement routine, for a predetermined time period to provide a first visual display varying over $2^n$ levels representing a plurality of levels of volume within said range if said decrement routine does not reduce said volume level to below a minimum value, and to provide a second visual display when said decrement routine reduces said volume level to zero and for subsequent removing the plurality of bars from the On-Screen Display after said predetermined time period.

2. A method for controlling a volume level according to claim 1, wherein the input discrimination routine comprises:

a key-check step for checking whether the key-input signal is transmitted from one of the transmitter and the key-matrix; and an input key-discrimination step for discriminating whether the key-input signal in the key-check step is one of the up-volume signal and the down-volume signal.

3. A method for controlling a volume level according to claim 1, wherein the increment routine comprises:

a bar-increment step for increasing the volume level of said pulse width modulated signal and the plurality of bars displayed by the On-Screen Display on the screen;

a maximum-discrimination step for discriminating whether the increased volume level is a maximum volume level; and a maximum value storing step for storing the maximum volume level when the increased volume level is the maximum volume level.

4. A method for controlling a volume level according to claim 1, wherein the decrement routine comprises:

a bar-decrement step for decreasing the volume level of said pulse width modulated signal and the plurality of bars displayed by the On-Screen Display on the screen;

a minimum-discrimination step for discriminating whether the decreased volume level is a minimum volume level; and a minimum-value storing step for storing the minimum volume when the decreased volume level is the minimum volume level.

5. A method for controlling a volume level according to claim 3, wherein the state display routine comprises:

a display step for displaying one of the increased and decreased volume level of said pulse width modulated signal in one of the increment and decrement routine on the screen; and a bar-removal step for removing the displayed plurality of bars after said predetermined time period.

6. A method for controlling a volume level according to claim 4, wherein the state display routine comprises:
   a display step for displaying one of the increased and decreased volume level of said pulse width modulated signal in one of the increment and decrement routine on the screen; and
   a bar-removal step for removing the displayed plurality of bars after said predetermined time period.

7. In a circuit for controlling and displaying a volume level of an audio sound having a MICOM for receiving a key-input signal transmitted from a transmitter and/or a key-matrix to provide a pulse width modulated signal having six-bits corresponding to sixty-four volume levels having a range extending from a minimum volume level of zero through a maximum volume level of sixty-three, a DC converter for converting the pulse width modulated signal into a DC level to control said volume level, and an on-screen display for displaying a plurality of bars indicative of said sixty-four volume levels of said audio sound, a method for controlling said volume level of audio sound, comprising the steps of:
   setting the six-bit pulse width modulated signal to a volume level; and
   displaying said volume level with a representation providing sixty-four volume levels on a first visual presentation of said on-screen display in a plurality of bar-type symbols wherein each bar-type symbol of said plurality of bar-type symbols corresponds to every two volume levels of said six-bits pulse width modulated signal and with a second visual presentation of said on-screen display corresponding to a volume level next adjacent to said sixty-four volume levels within said range by the steps of:
   checking whether the key-input signal is transmitted from one of the transmitter and the key-matrix;
   discriminating whether the key-input signal in the key-check step is one of the up-volume signal and the down-volume signal;
   increasing the volume level of the pulse width modulated signal and the plurality of bars displayed by the on-screen display on the screen when the key-input signal is an up-volume signal, and discriminating whether the increased volume level is a maximum volume level, and storing the maximum volume level when the increased volume level is the maximum volume level;
   decreasing the volume level of the pulse width modulated signal and the plurality of bars by the on-screen display on the screen when the key-input signal is a down-volume signal, discriminating whether the decreased volume level is a minimum volume level, and storing the minimum volume level when the decreased volume level is the minimum volume level; and
   displaying the plurality of bars on the on-screen display in dependence upon reception of one of the increased and decreased volume level of the pulse width modulated signal for a predetermined time period.

8. A method for controlling an On-Screen Display apparatus by using a six-bit pulse width modulated signal having a corresponding sixty-four levels, comprising:
   setting said six-bit pulse width modulated signal to a value within a range having a minimum volume level and having a maximum volume level of sixty-four; and
   displaying said value within one of sixty-four levels on said On-Screen Display apparatus in a plurality of bar-type symbols wherein in a first display, each bar-type symbol of said plurality of bar-type symbols corresponds to every two levels of said six-bit pulse width modulated signal the number of said bar-type symbols varying in number in dependence upon reception of said value, and displaying a second visual display representing a zero volume level when said value is reduced to less than said minimum level.

9. An audio volume controlling apparatus for an audio system, comprising:
   means for transmitting a command signal representative of a volume-up signal and a volume-down signal to said audio system;
   signal processor means for processing said command signal to provide a volume control signal in dependence upon said command signal by pulse width modulation, with said volume control signal representing a 6-bits Pulse Width Modulated signal corresponding to sixty-four volume levels having a minimum volume level and a maximum volume level of sixty-four; and
   On-Screen Display means for displaying bar-type symbols in dependence upon said volume control signal on a screen of said audio system, said number of bar-type symbols proportionally corresponding to said volume levels of said six-bit pulse width modulated signaling a first visual display of said display means providing a plurality of said bar-type symbols varying in number in dependence upon said volume control signal, and for displaying a second visual display representing zero volume level when said command signal reduces said volume control signal to a value less than said minimum volume level.

10. An audio volume controlling apparatus according to claim 9, wherein said signal processor means processes said command signal in the steps of:
    determining whether said command signal is being transmitted;
    determining whether said command signal being transmitted represents one of a volume-up signal and a volume-down signal; and
    generating said volume control signal in accordance with one of said volume-up signal and said volume-down signal, said volume control signal corresponding to said number of bar-type symbols displaying on the screen of said audio system by said on-screen display means.

11. An audio volume controlling apparatus according to claim 9, wherein said on-screen display means displays said plurality of bar-type symbols for a predetermined time period.

* * * * *

UNITED STATES PATENT AND TRADEMARK OFFICE
CERTIFICATE OF CORRECTION

PATENT NO. : 5,191,620

DATED : 2 March 1993

INVENTOR(S) : Sang-Su LEE

It is certified that error appears in the above-identified patent and that said Letters Patent is hereby corrected as shown below:

Claim 4,      Column 4,      Line 59,      insert --level-- before "when";

Claim 8,      Column 6,      Line          insert --,-- after "signal".

Column 6,      Line

Signed and Sealed this

Twenty-sixth Day of April, 1994

*Attest:*

BRUCE LEHMAN

*Attesting Officer*     Commissioner of Patents and Trademarks